United States Patent
Kerr et al.

(10) Patent No.: US 10,608,623 B2
(45) Date of Patent: Mar. 31, 2020

(54) TRANSISTOR-BASED RADIO FREQUENCY (RF) SWITCH

(71) Applicant: Qorvo US, Inc., Greensboro, NC (US)

(72) Inventors: Daniel Charles Kerr, Oak Ridge, NC (US); Jinsung Choi, Greensboro, NC (US); Baker Scott, San Jose, CA (US); George Maxim, Saratoga, CA (US); Hideya Oshima, Santa Clara, CA (US)

(73) Assignee: Qorvo US. Inc., Greensboro, NC (US)

( * ) Notice: Subject to any disclaimer, the term of this patent is extended or adjusted under 35 U.S.C. 154(b) by 0 days.

(21) Appl. No.: 16/402,512

(22) Filed: May 3, 2019

(65) Prior Publication Data
US 2019/0260366 A1    Aug. 22, 2019

Related U.S. Application Data

(63) Continuation-in-part of application No. 15/849,074, filed on Dec. 20, 2017, now Pat. No. 10,320,379.

(60) Provisional application No. 62/437,420, filed on Dec. 21, 2016.

(51) Int. Cl.
| | |
|---|---|
| *H03K 17/041* | (2006.01) |
| *H03K 17/16* | (2006.01) |
| *H03K 17/10* | (2006.01) |
| *H03K 17/693* | (2006.01) |
| *H04B 1/44* | (2006.01) |

(52) U.S. Cl.
CPC .............................. *H03K 17/04106* (2013.01)

(58) Field of Classification Search
CPC combination set(s) only.
See application file for complete search history.

(56) References Cited

U.S. PATENT DOCUMENTS

| | | |
|---|---|---|
| 4,317,055 A | 2/1982 | Yoshida et al. |
| 5,382,826 A | 1/1995 | Mojaradi et al. |
| 6,803,680 B2 | 10/2004 | Brindle et al. |
| (Continued) | | |

OTHER PUBLICATIONS

Kelly, D. et al., "The state-of-the-art of silicon-on-sapphire CMOS RF switches," IEEE 2005 Compound Semiconductor Integrated Circuit Symposium, Oct. 30-Nov. 2, 2005, pp. 200-203.

(Continued)

*Primary Examiner* — An T Luu
(74) *Attorney, Agent, or Firm* — Withrow & Terranova, P.L.L.C.

(57) ABSTRACT

A transistor-based radio frequency (RF) switch that provides symmetric RF impedance is disclosed. The transistor-based RF switch includes an N number of main field-effect transistors (FETs) stacked in series between a first end node and a second end node. A first end-network is coupled between the first end node and a proximal gate node. The first end-network provides a first variable impedance that equalizes a drain-to-source voltage of the first main FET to within a predetermined percentage of a drain-to-source voltage of a second main FET of the N number of main FETs. A second end-network is coupled between the second end node and the distal gate node, wherein the second end-network provides a second variable impedance to equalize the drain-to-source voltage of an Nth main FET to within the predetermined percentage of the drain-to-source voltage of an N−1 main FET of the N number of main FETs.

20 Claims, 16 Drawing Sheets

(56) References Cited

U.S. PATENT DOCUMENTS

| | | | |
|---|---|---|---|
| 7,345,521 | B2 | 3/2008 | Takahashi et al. |
| 7,459,988 | B1 | 12/2008 | Iversen |
| 8,373,490 | B2 | 2/2013 | Burgener et al. |
| 8,461,903 | B1 | 6/2013 | Granger-Jones |
| 8,723,260 | B1 | 5/2014 | Carroll et al. |
| 8,749,296 | B2 | 6/2014 | Granger-Jones |
| 8,779,859 | B2 | 7/2014 | Su et al. |
| 9,048,836 | B2 | 6/2015 | Maxim et al. |
| 9,143,124 | B2 | 9/2015 | Cam et al. |
| 9,190,994 | B2 | 11/2015 | Hurwitz |
| 9,214,932 | B2 | 12/2015 | Clausen et al. |
| 9,628,075 | B2 | 4/2017 | Cebi et al. |
| 9,667,244 | B1 | 5/2017 | Cavus et al. |
| 9,712,158 | B1 | 7/2017 | Cavus et al. |
| 9,843,293 | B1 | 12/2017 | Wagh et al. |
| 9,876,496 | B2 * | 1/2018 | Yoo ............... H03K 17/693 |
| 9,948,281 | B2 | 4/2018 | Ranta |
| 9,960,737 | B1 | 5/2018 | Kovac |
| 9,979,387 | B2 | 5/2018 | Wu |
| 10,056,901 | B2 * | 8/2018 | Roy ............... H03K 17/693 |
| 2003/0181167 | A1 | 9/2003 | Iida |
| 2006/0194558 | A1 | 8/2006 | Kelly |
| 2008/0265978 | A1 | 10/2008 | Englekirk |
| 2011/0025404 | A1 | 2/2011 | Cassia |
| 2012/0049956 | A1 | 3/2012 | Lam |
| 2013/0278317 | A1 | 10/2013 | Iversen et al. |
| 2014/0009214 | A1 | 1/2014 | Altunkilic et al. |
| 2014/0253217 | A1 | 9/2014 | Briere |
| 2015/0270806 | A1 | 9/2015 | Wagh et al. |
| 2015/0381171 | A1 | 12/2015 | Cebi et al. |
| 2016/0322385 | A1 | 11/2016 | Fuh et al. |
| 2016/0329891 | A1 | 11/2016 | Bakalski et al. |
| 2017/0201244 | A1 | 7/2017 | Kerr |
| 2017/0201245 | A1 | 7/2017 | Scott et al. |
| 2017/0201248 | A1 | 7/2017 | Scott et al. |
| 2017/0272066 | A1 | 9/2017 | Scott et al. |
| 2018/0145678 | A1 | 5/2018 | Maxim et al. |
| 2018/0167062 | A1 | 6/2018 | Shanjani et al. |

OTHER PUBLICATIONS

Shifrin, M.B. et al., "Monolithic FET structures for high-power control component applications," IEEE Transactions on Microwave Theory and Techniques, Dec. 1989, pp. 2134-2141, vol. 37, No. 12.

Tinella, C. et al., "0.13/spl mu/m CMOS SOI SP6T antenna switch for multi-standard handsets," 2006 Topical Meeting on Silicon Monolithic Integrated Circuits in RF Systems, Jan. 18-20, 2006, pp. 58-61.

Non-Final Office Action for U.S. Appl. No. 12/880,634, dated Aug. 10, 2012, 5 pages.

Final Office Action for U.S. Appl. No. 12/880,634, dated Nov. 26, 2012, 8 pages.

Notice of Allowance for U.S. Appl. No. 13/892,992, dated Feb. 7, 2014, 7 pages.

Non-Final Office Action for U.S. Appl. No. 13/892,992, dated Oct. 10, 2013, 5 pages.

Notice of Allowance for U.S. Appl. No. 15/294,337, dated Jul. 7, 2018, 10 pages.

Non-Final Office Action for U.S. Appl. No. 15/585,345, dated Feb. 23, 2018, 5 pages.

Lu, Jian et al., "Modeling, Design, and Characterization of Multiturn Bondwire Inductors With Ferrite Epoxy Glob Cores for Power Supply System-on-Chip or System-in-Package Applications," IEEE Transactions on Power Electronics, vol. 25, Issue 8, Aug. 2010, pp. 2010-2017.

Notice of Allowance for U.S. Appl. No. 15/294,337, dated Dec. 10, 2018, 5 pages.

Non-Final Office Action for U.S. Appl. No. 15/401,936, dated Sep. 12, 2018, 14 pages.

Final Office Action for U.S. Appl. No. 15/401,936, dated Feb. 26, 2019, 14 pages.

Notice of Allowance for U.S. Appl. No. 15/401,936, dated Jun. 7, 2019, 8 pages.

Non-Final Office Action for U.S. Appl. No. 15/849,074, dated Jul. 30, 2018, 8 pages.

Notice of Allowance for U.S. Appl. No. 15/849,074, dated Jan. 25, 2019, 7 pages.

Non-Final Office Action for U.S. Appl. No. 15/401,903, dated Sep. 6, 2018, 14 pages.

Final Office Action for U.S. Appl. No. 15/401,903, dated Jan. 15, 2019, 14 pages.

Non-Final Office Action for U.S. Appl. No. 15/401,903, dated Feb. 26, 2019, 14 pages.

Notice of Allowance for U.S. Appl. No. 15/401,903, dated Jun. 4, 2019, 9 pages.

* cited by examiner

TRANSISTOR-BASED RADIO FREQUENCY (RF) SWITCH

RELATED APPLICATIONS

This application is a continuation-in-part of U.S. patent application Ser. No. 15/849,074, filed Dec. 20, 2017, now patented as U.S. Pat. No. 10,320,379 on Jun. 11, 2019, which claims the benefit of provisional patent application Ser. No. 62/437,420, filed Dec. 21, 2016, the disclosures of which are hereby incorporated herein by reference in their entireties.

FIELD OF THE DISCLOSURE

Embodiments of the present disclosure relate to silicon-on-insulator technology and semiconductor-based radio frequency switches, both of which can be used in radio frequency communications circuits.

BACKGROUND

As technology progresses, wireless communications devices, such as smart phones, wireless capable computers, and the like, are becoming increasingly integrated, feature rich, and complex. Such wireless communications devices rely on semiconductor technologies, such as silicon-based technologies, which are evolving toward smaller circuit geometries, lower power consumption, higher operating speeds, and increased complexity. Complementary metal oxide semiconductor technology is an example of a silicon-based technology. Further, wireless communications devices may need to support multiple communications bands, multiple communications modes, multiple communications protocols, and the like. As such, wireless communications devices rely upon transistor-based radio frequency (RF) switches to select between different RF circuits depending on which communications bands, modes, and protocols are in use. Such complex RF systems may place strict linearity, insertion loss, and isolation demands on the transistor-based RF switches.

In general, transistor-based RF switches used to switch RF power within communications circuitry have a stringent linearity requirement. The already stringent linearity requirement is increasing due to downlink and uplink carrier aggregation. In some instances, the noise contributed by the circuit nonlinearities should be less than −115 dBm. Thus, there is a need for transistor-based RF switches having improved linearity performance to meet increased transistor-based RF switch linearity requirements.

SUMMARY

A transistor-based radio frequency (RF) switch that provides symmetric RF impedance is disclosed. The transistor-based RF switch includes an N number of main field-effect transistors (FETs) stacked in series between a first end node and a second end node such that a first terminal of a first main FET of the N number of main FETs is coupled to the first end node and a second terminal of an Nth main FET of the N number of main FETs is coupled to the second end node, wherein N is a finite number greater than two. Further included is a plurality of gate resistors coupled in series between a proximal gate node and a distal gate node, wherein each gate resistor of the plurality of gate resistors is coupled between gates of an adjacent pair of the N number of main FETs. A first end-network is coupled between the first end node and the proximal gate node, wherein the first end-network provides a first variable impedance that equalizes a drain-to-source voltage of the first main FET to within a predetermined percentage of a drain-to-source voltage of a second main FET of the N number of main FETs. A second end-network is coupled between the second end node and the distal gate node, wherein the second end-network provides a second variable impedance to equalize the drain-to-source voltage of an Nth main FET to within the predetermined percentage of the drain-to-source voltage of an N−1 main FET of the N number of main FETs.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
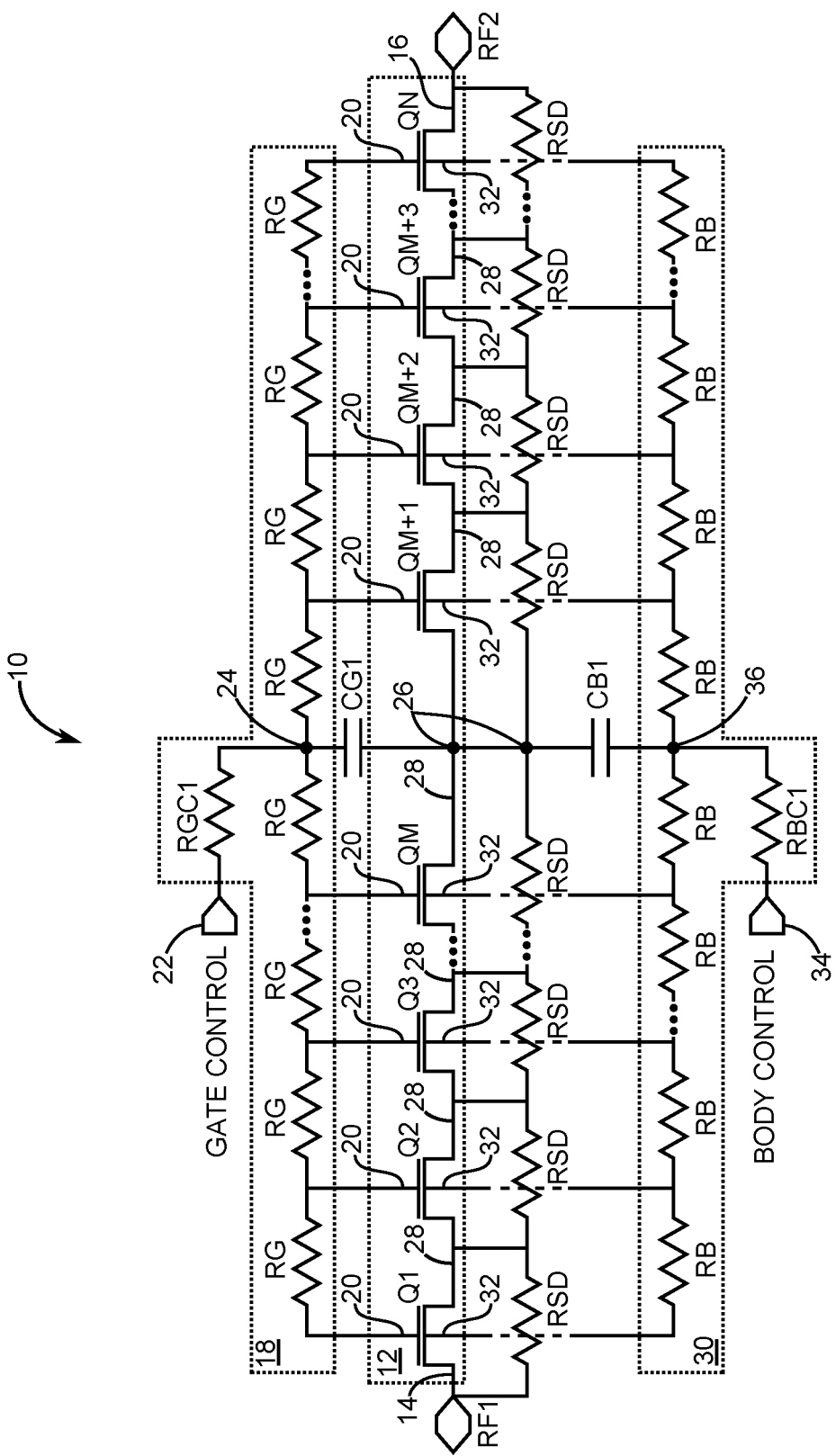
FIG. 1 is a schematic diagram of a first embodiment of a transistor-based radio frequency (RF) switch that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic diagram of a first embodiment of a transistor-based radio frequency (RF) switch 10 that is structured in accordance with the present disclosure. The transistor-based RF switch 10 has an N number of main field-effect transistors (FETs) 12 that are stacked in series such that a first terminal 14 of a first main FET Q1 is coupled to a first end node RF1 and a second terminal 16 of an Nth main FET QN is coupled to a second end node RF2, wherein N is a finite number greater than five. In at least some embodiments, the N number of main FETs 12 are of the silicon-on-insulator type. The transistor-based RF switch 10 further includes a gate bias network 18 having a plurality of gate resistors RG. In general, individual ones of the plurality of gate resistors RG are coupled to gate terminals 20 of the N number of main FETs 12. In particular, in the exemplary embodiment of FIG. 1, one of the plurality of gate resistors RG is coupled between gate terminals 20 of adjacent ones of the N number of main FETs 12. The gate bias network 18 further includes a common gate resistor RGC1 that is coupled between a gate control input 22 and a gate control node 24 of the plurality of gate resistors RG. In exemplary embodiments of the transistor-based RF switch 10, the gate control node 24 is located between a first group of the plurality of gate resistors RG to the left and a second group of the plurality of gate resistors RG to the right, wherein the number of gate resistors RG in the first group is equal to the number of gate resistors RG in the second group.

A first gate capacitor CG1 is coupled between the gate control node 24 and a switch path node 26 of the N number of main FETs 12. In exemplary embodiments, the switch path node 26 is located between a first group Q1 through QM of the N number of main FETs 12 and a second group QM+1 through QN of the N number of main FETs 12, wherein the first group of the N number of main FETs 12 is equal in number to the second group of the N number of main FETs 12. In the exemplary embodiment of FIG. 1, the first group is made up of four main FETS Q1, Q2, Q3, and QM, and the second group is made up of four main FETs QM+1, QM+2, QM+3, and QN, wherein M is set to 4 and N is set to 8. However, it is to be understood that N can be any counting number greater than 5. For example, if N is set to 32, then the first group and the second group each have 16 FETs apiece.

The transistor-based RF switch 10 further includes a plurality of source-to-drain resistors RSD that are coupled between source/drain terminals 28. The transistor-based RF switch 10 still further includes a body bias network 30 having a plurality of body resistors RB, wherein each body resistor of the plurality of body resistors RB is coupled between body terminals 32 of an adjacent pair of the N number of main FETs 12. The body bias network 30 further includes a common body resistor RBC1 that is coupled between a body control input 34 and a body control node 36 of the plurality of body resistors RG. A first body capacitor CB1 is coupled between the body control node 36 and the switch path node 26 of the N number of main FETs 12. In some embodiments a capacitance value of the gate capacitor CG1 and the body capacitor CB1 is between 0.1 picofarad and 10 picofarads. In some embodiments, the capacitance value of the gate capacitor CG1 and the body capacitor CB1 is between 0.1 picofarad and 1 picofarad. In yet other embodiments, the capacitance value of the gate capacitor CG1 and the body capacitor CB1 is between 1 picofarad and 10 picofarads. In some embodiments, both of the gate capacitor CG1 and the body capacitor CB1 capacitor are metal-insulator-metal type capacitors. Moreover, in some embodiments, a resistance value of the common gate resistor RGC1 and the common body resistor RBC1 is between 2 k$\Omega$ and 100 k$\Omega$. In some embodiments, the resistance value of the common gate resistor RGC1 and the common body resistor RBC1 is between 2 k$\Omega$ and 10 k$\Omega$. In other embodiments the resistance value of the common gate resistor RGC1 and the common body resistor RBC1 is between 10 k$\Omega$ and 100 k$\Omega$. In at least some embodiments, the resistance of each of the plurality of gate resistors RG is equal to the resistance of the common gate resistor RGC1 within ±10%.

In operation, bias voltages are applied to the gate control input 22 and the body control input 34, causing the first gate capacitor CG1 and the first body capacitor CB1 to charge and thereby balance the gate bias voltage and body bias voltage applied to each of the N number of main FETs 12. Harmonics generated by the transistor-based RF switch 10 are reduced as a result of the balanced gate bias voltage and balanced body bias voltage applied to each of the N number of main FETs 12. In at least some embodiments, second harmonics are reduced by greater than 30 dB compared with the structure of the transistor-based RF switch 10 without the first gate capacitor CG1 and the first body capacitor CB1.

Figure 2:
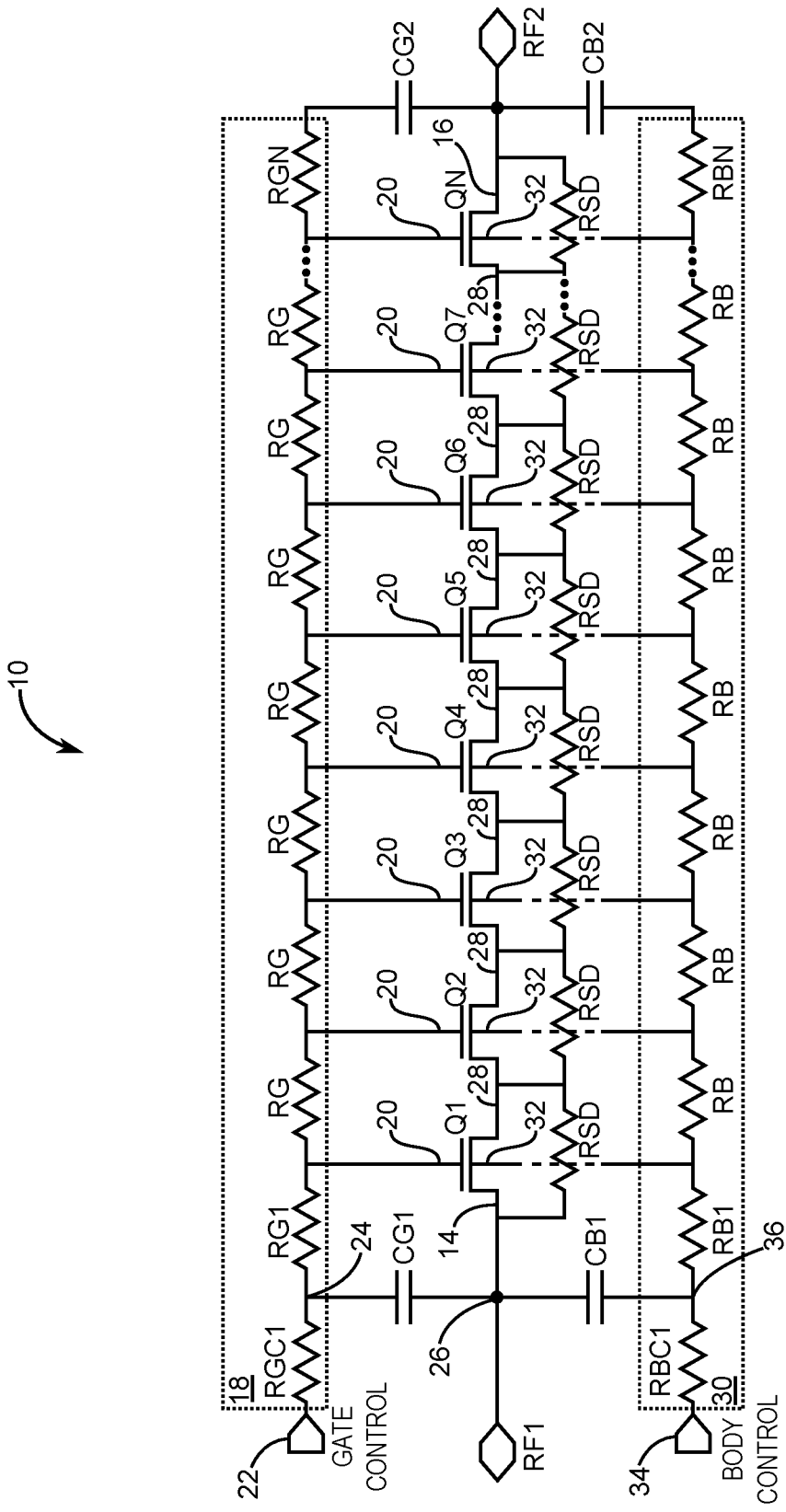
FIG. 2 is a schematic diagram of a second embodiment of the transistor-based RF switch that is structured in accordance with the present disclosure.

FIG. 2 is a schematic diagram of an exemplary second embodiment of the transistor-based RF switch 10 that is structured in accordance with the present disclosure. In this exemplary second embodiment, the switch path node 26 is located such that the first terminal 14 of the first main FET Q1 is coupled directly to the switch path node 26. Moreover, in this exemplary second embodiment, the gate control node 24 is located between the common gate resistor RGC1 and a first gate resistor RG1 of the plurality of gate resistors RG and is coupled to one of the gate terminals 20 associated with the first main FET Q1. The first gate capacitor CG1 is coupled between the gate control node 24 and the switch path node 26. Further still, in this exemplary second embodiment, the body control node 36 is located between the common body resistor RBC1 and a first body resistor RB1 of the plurality of body resistors RB and is coupled to one of the body terminals 32 associated with the first main FET Q1. The first body capacitor CB1 is coupled between the body control node 36 and the switch path node 26.

A second gate capacitor CG2 is coupled between the second terminal 16 of the Nth main FET QN and one of the gate terminals 20 associated with the Nth main FET QN through a last gate resistor RGN of the plurality of gate resistors RG nearest to the second end node RF2. A second body capacitor CB2 is coupled between the second terminal 16 of the Nth main FET QN and one of the body terminals 32 associated with the Nth main FET QN through a last body resistor RBN of the plurality of body resistors RB nearest to the second end node RF2.

Figure 3:
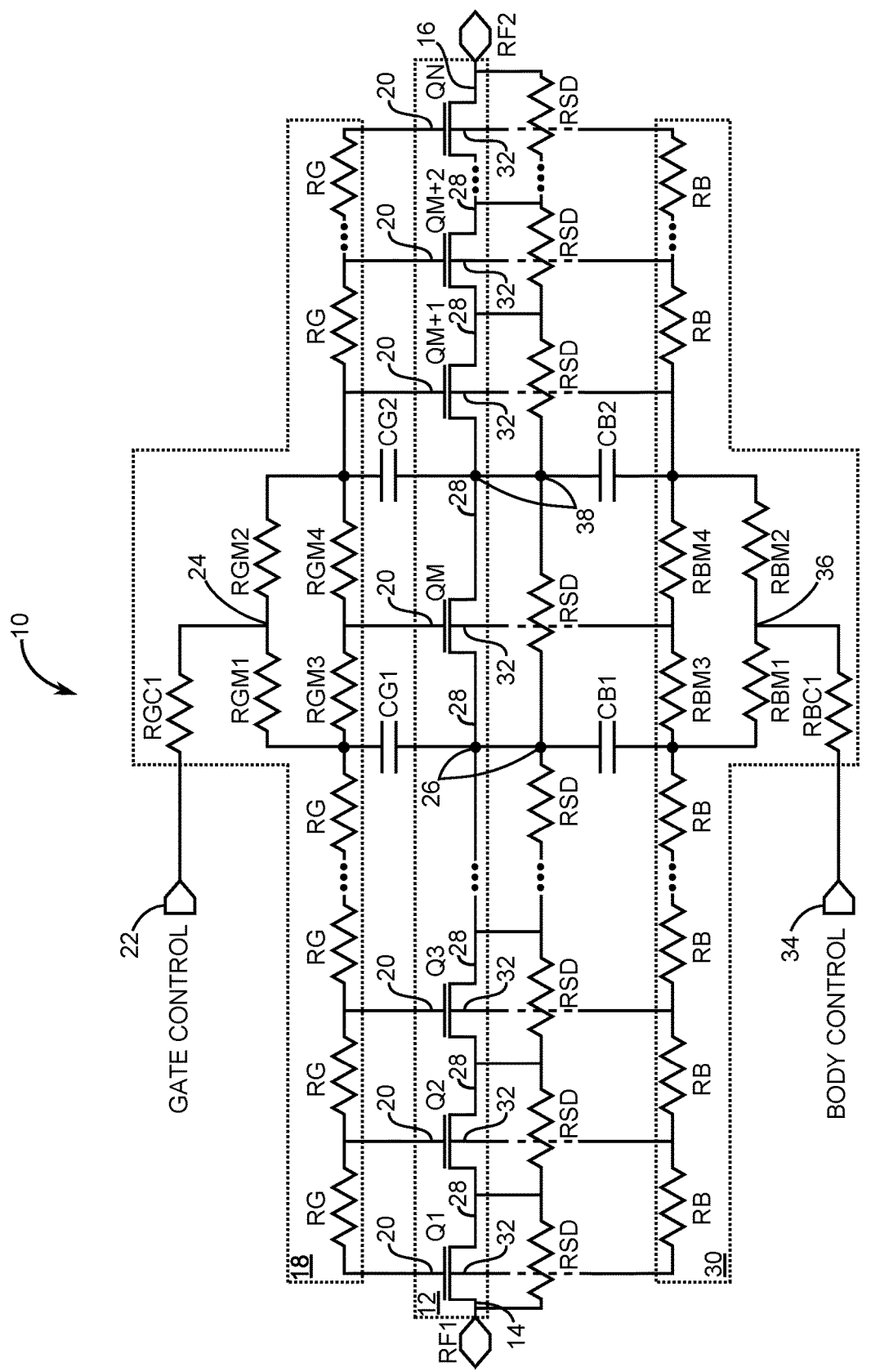
FIG. 3 is a schematic diagram of a third embodiment of the transistor-based RF switch that is structured in accordance with the present disclosure.

FIG. 3 is a schematic diagram of a third embodiment of a transistor-based RF switch 10 that is structured in accordance with the present disclosure. In this third exemplary embodiment, the first gate capacitor CG1 is coupled to the gate control node 24 through a first middle gate resistor RGM1. Moreover, the second gate capacitor CG2 is coupled between the gate control node 24 and a second switch path node 38 through a second middle gate resistor RGM2. Also, in this exemplary third embodiment, N is an odd number and the middle FET QM of the N number of main FETs 12 is coupled directly between the switch path node 26 and the second switch path node 38. The resistance values of the first middle gate resistor RGM1 and the second middle gate resistor RGM2 are typically within ±10% of the same resistance value of the other ones of the plurality of gate resistors RG. However, a third middle gate resistor RGM3 and a fourth middle gate resistor RGM4 that are coupled directly to the gate terminal 20 of the middle FET QM typically have twice the resistance value ±10% of the other ones of the plurality of gate resistors RG.

Further still, in this third exemplary embodiment, the first body capacitor CB1 is coupled to the body control node 36 through a first middle body resistor RBM1. Moreover, the second body capacitor CB2 is coupled between the body control node 36 and the second switch path node 38 through a second middle body resistor RBM2. The resistance values of the first middle body resistor RBM1 and the second middle body resistor RBM2 are typically within ±10% the same resistance value of the other ones of the plurality of body resistors RB. However, a third middle body resistor RBM3 and a fourth middle body resistor RBM4 that are coupled directly to the body terminal 32 of the middle FET QM typically have twice the resistance value ±10% of the other ones of the plurality of body resistors RB.

Figure 4:
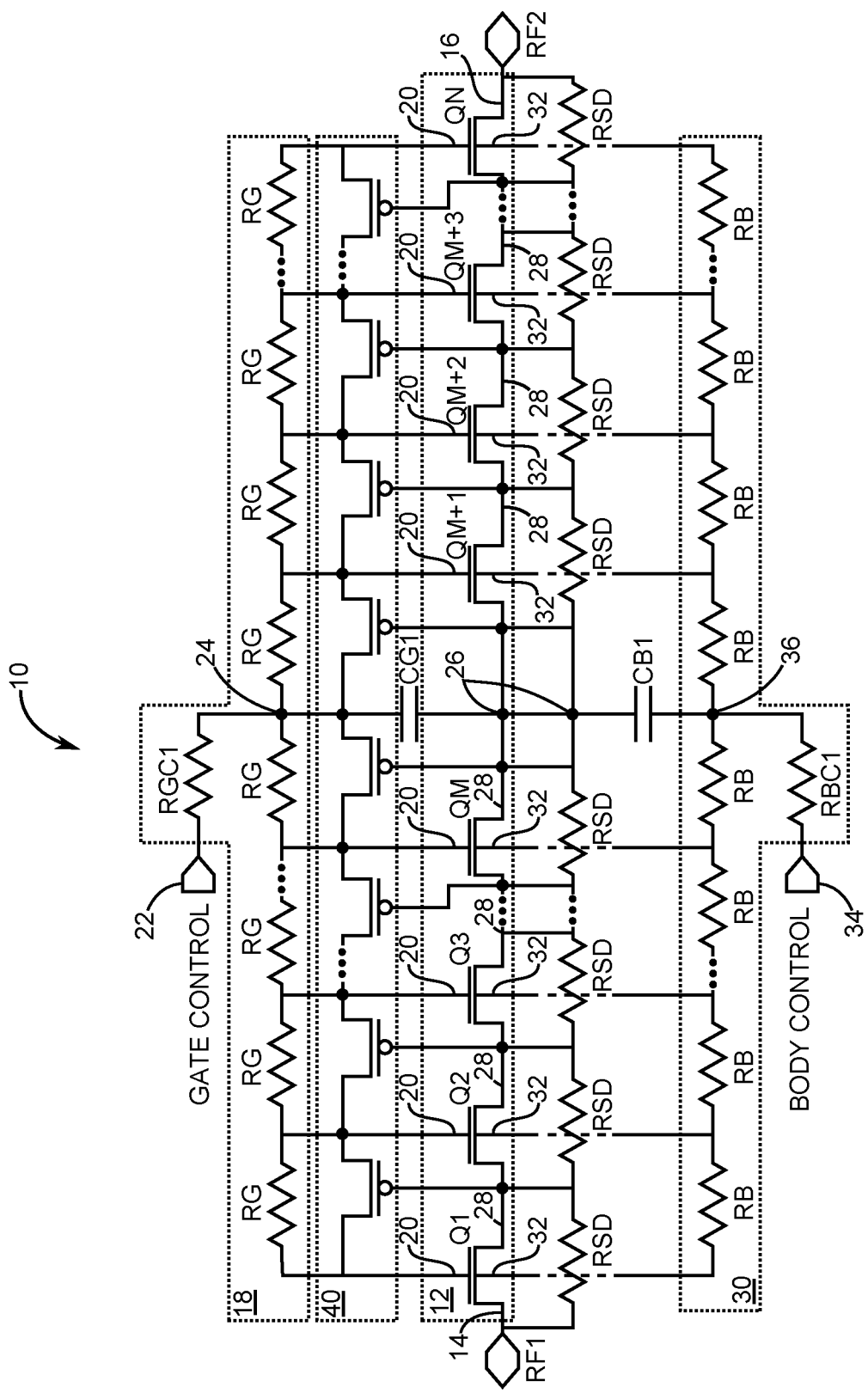
FIG. 4 is a schematic of a fourth embodiment of the transistor-based RF switch that is structured in accordance with the present disclosure.

FIG. 4 is a schematic of a fourth embodiment of the transistor-based RF switch 10 that is structured in accordance with the present disclosure. This exemplary fourth embodiment has a structure that is identical to the structure of the first embodiment of FIG. 1 with an exception of an addition of a plurality of speed-up FETs 40. Individual ones of the plurality of speed-up FETs 40 are coupled across corresponding ones of the plurality of gate resistors RG such that the plurality of gate resistors RG are shorted when the plurality of speed-up FETs 40 are in an ON state.

Figure 5:
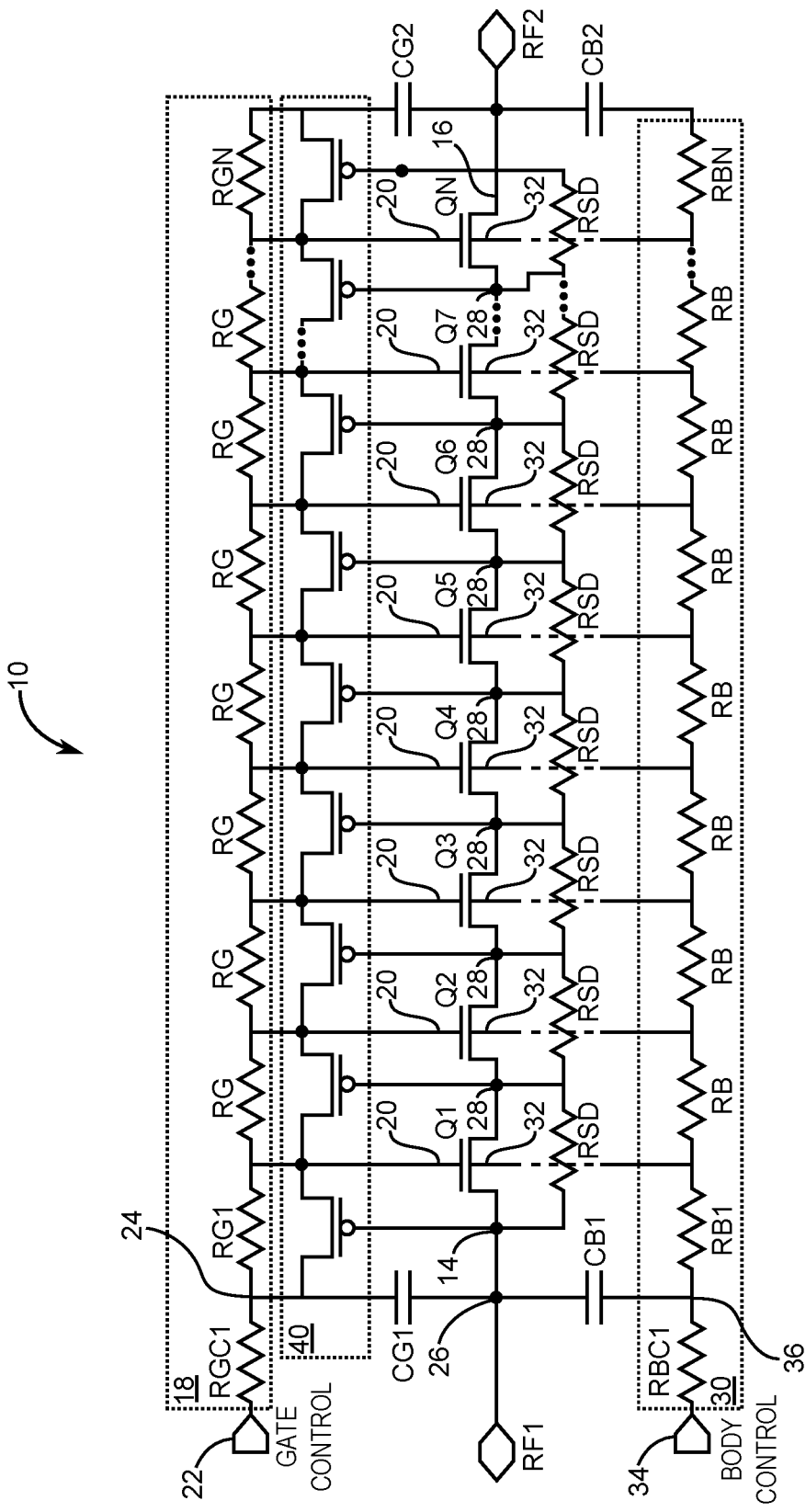
FIG. 5 is a schematic of a fifth embodiment of the transistor-based RF switch that is structured in accordance with the present disclosure.

FIG. 5 is a schematic of a fifth embodiment of the transistor-based RF switch 10 that is structured in accordance with the present disclosure. This exemplary fourth embodiment has a structure that is identical to the structure of the second embodiment of FIG. 2 with an exception of an addition of the plurality of speed-up FETs 40. As with the fourth embodiment of FIG. 4, individual ones of the plurality of speed-up FETs 40 are coupled across corresponding ones of the plurality of gate resistors RG such that the plurality of gate resistors RG are shorted when the plurality of speed-up FETs 40 are in an ON state.

Figure 6:
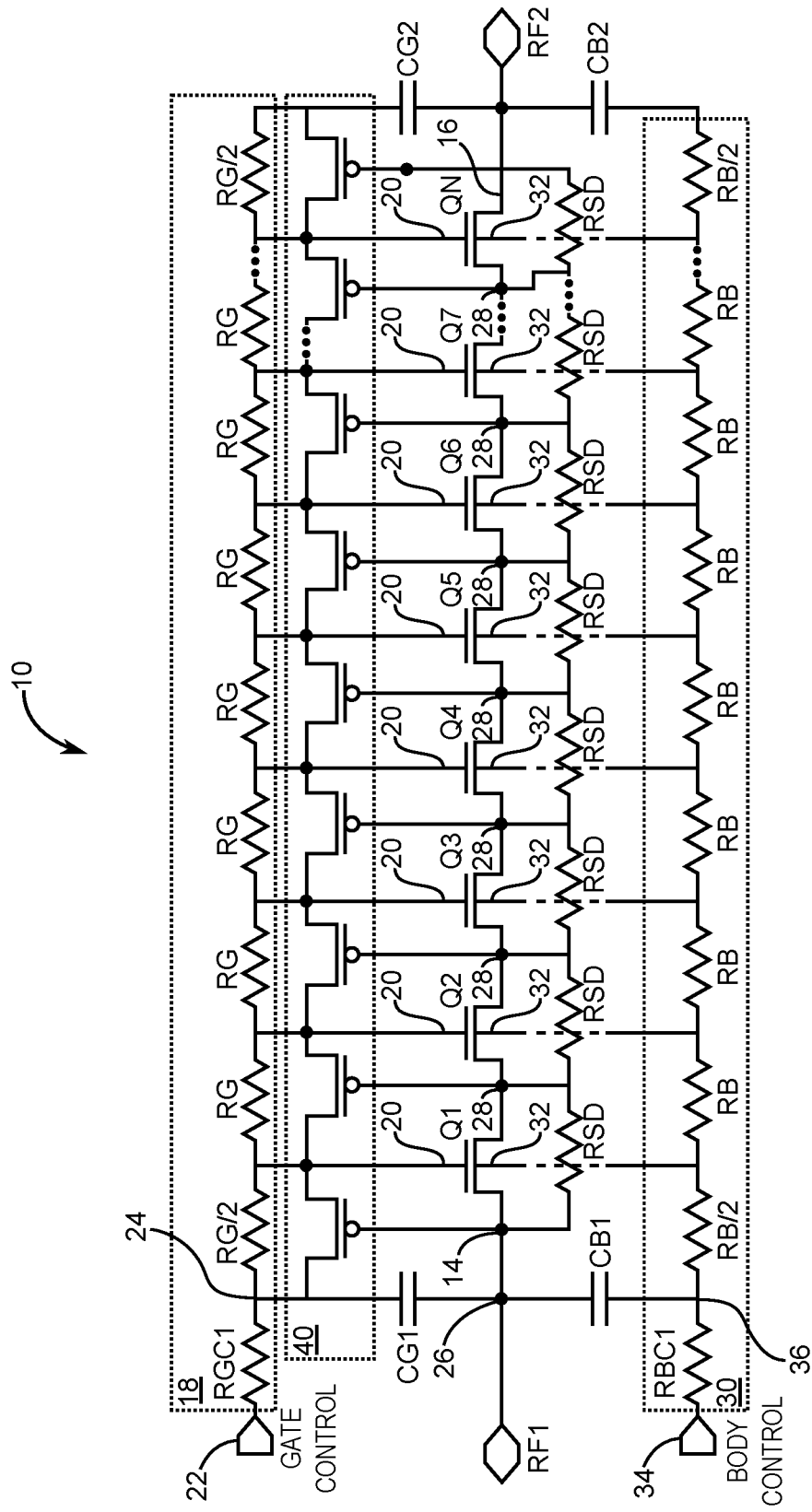
FIG. 6 is a schematic of a sixth embodiment of the transistor-based RF switch that is structured in accordance with the present disclosure.

FIG. 6 is a schematic of a sixth embodiment of the transistor-based RF switch 10 that is structured in accordance with the present disclosure. Performance of the sixth embodiment is enhanced in some applications over the fifth embodiment of FIG. 5 by fixing the resistance values of a nearest one of the plurality of gate resistors RG to the first end node RF1 and a nearest one of the plurality of gate resistors RG to the second end node RF2 to half the resistance value ±10% of individual ones of the remaining plurality of gate resistors RG. Performance of this sixth embodiment is further enhanced over the fifth embodiment in the same applications by fixing the resistance values of a nearest one of the plurality of body resistors RB to the first end node RF1 and a nearest one of the plurality of body resistors RB to the second end node RF2 to half the resistance value ±10% of individual ones of the remaining plurality of body resistors RB. For example, the fifth embodiment of FIG. 5 can be realized as the sixth embodiment by fixing the resistance values of the first gate resistor RG1 (FIG. 5), the last gate resistor RGN (FIG. 5), the first body resistor RB1 (FIG. 5), and the last body resistor RBN (FIG. 5) to within ±10% of half the resistance of individual ones of the remaining gate resistors RG and body resistors RB, respectively.

Figure 7:
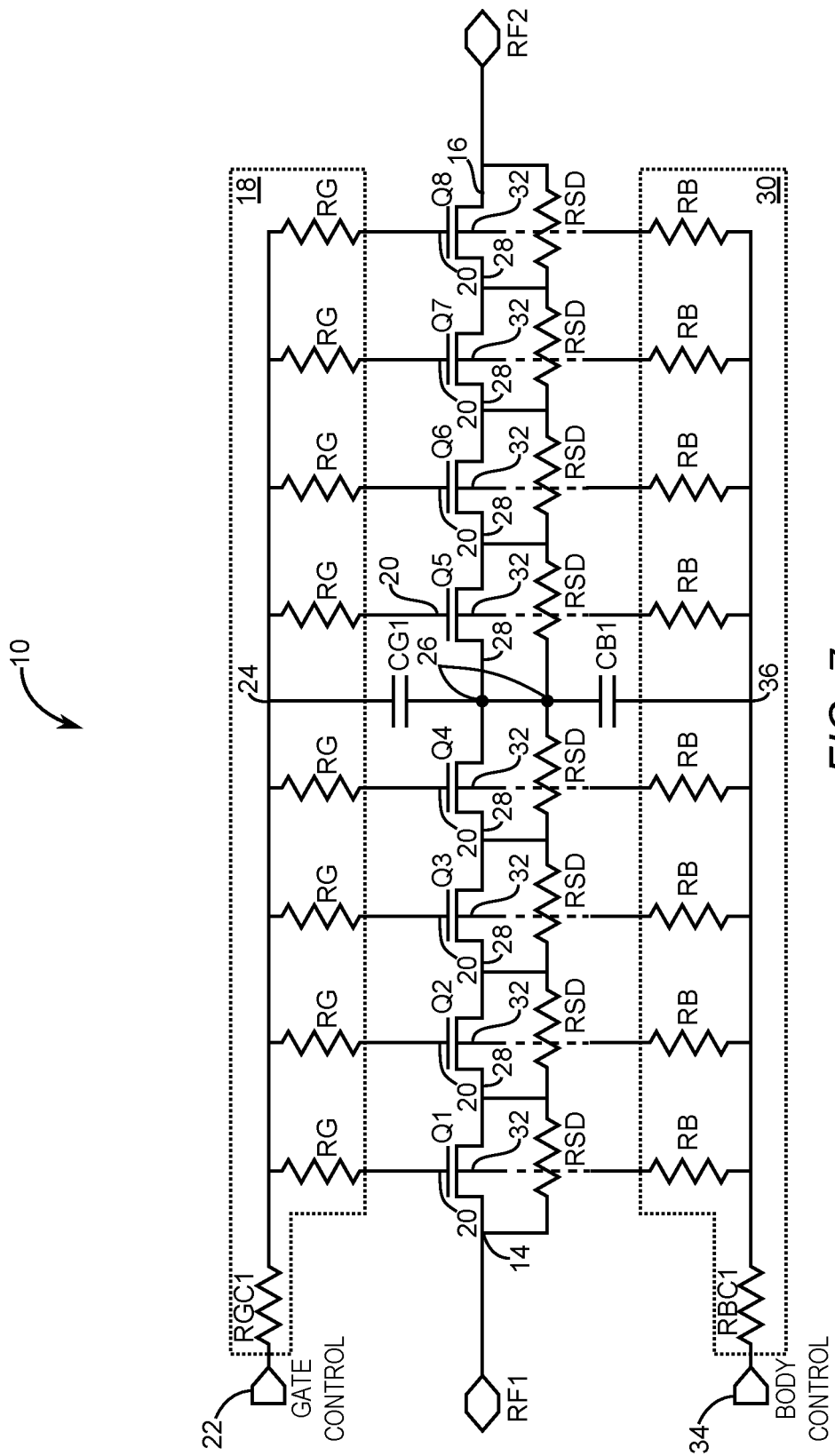
FIG. 7 is a schematic of a seventh embodiment of the transistor-based RF switch that is structured in accordance with the present disclosure.

FIG. 7 is a schematic of a seventh embodiment of the transistor-based RF switch 10 that is structured in accordance with the present disclosure. In this exemplary seventh embodiment, the gate bias network 18 is a parallel bias network, wherein individual ones of the plurality of gate resistors RG are coupled between the gate control node 24 and the gate terminals 20 of the N number of main FETs 12. Also, the switch path node 26 is located between a first group of the N number of main FETs 12 and a second group of the N number of main FETS 12 such that the first group and the second group have an equal number of FETs. In the exemplary embodiment, the first group is made up of FETs Q1-Q4 and the second group is made up of FETs Q5-Q8. In this exemplary embodiment, the first gate capacitor CG1 is coupled between the gate control node 24 and the switch path node 26. Further still, in this exemplary seventh embodiment, the body bias network 30 is a parallel bias network, wherein individual ones of the plurality of body resistors RB are coupled between the body control node 36 and the body terminals 32 of the N number of main FETs 12. Also, the first body capacitor CB1 is coupled between the body control node 36 and the switch path node 26.

Figure 8:
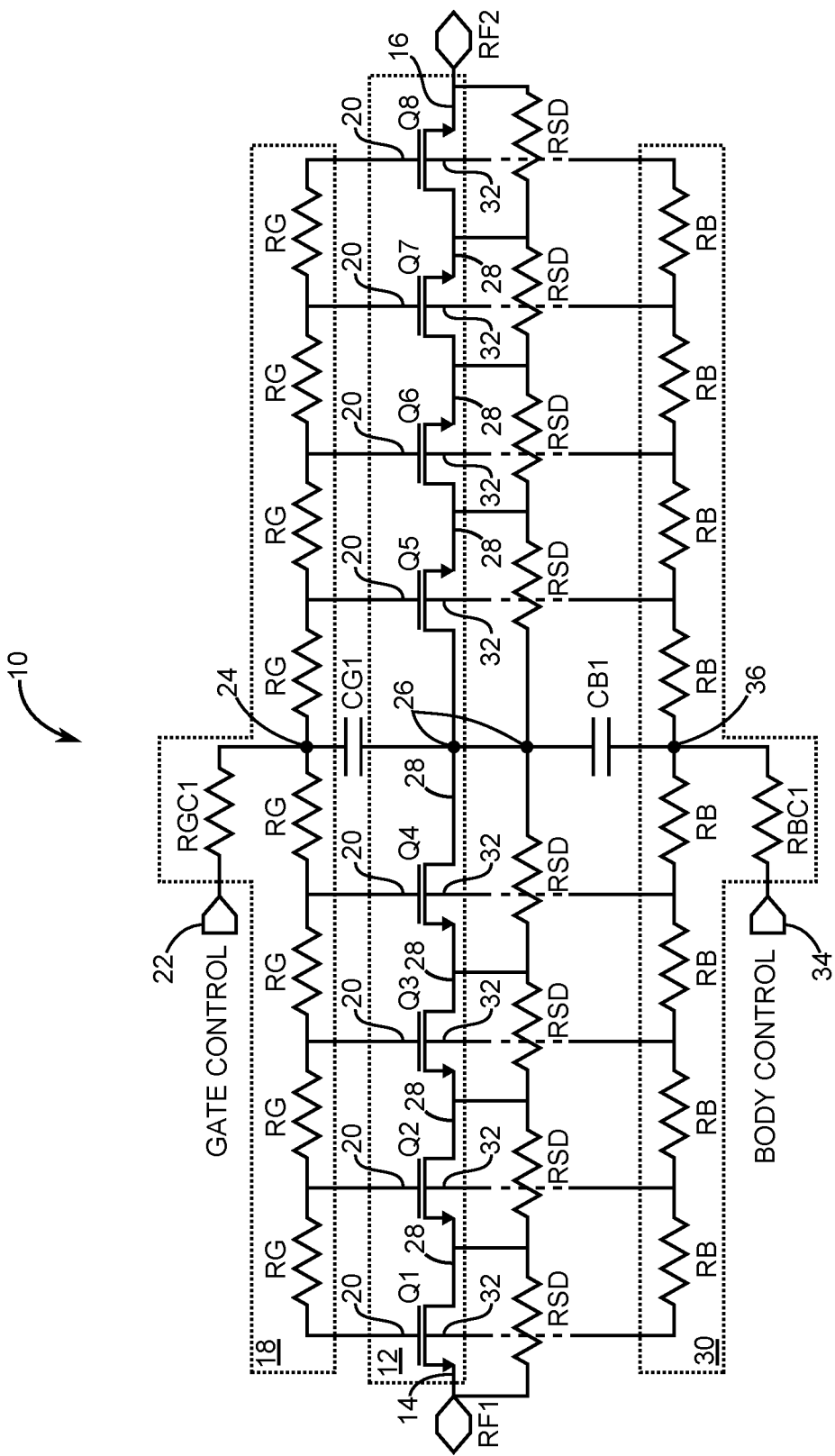
FIG. 8 is a schematic of an eighth embodiment of the transistor-based RF switch that is structured in accordance with the present disclosure.

FIG. 8 is a schematic of an eighth embodiment of the transistor-based RF switch 10 that is structured in accordance with the present disclosure. In this exemplary eighth embodiment, a first group Q1-Q4 of the N number of main FETs 12 has source terminals that are closer to the first end node RF1 and drain terminals that are closer to the second end node RF2, and a second group Q5-Q8 of the N number of main FETs 12 has drain terminals that are closer to the first end node RF1 and source terminals that are closer to the second end node RF2, wherein the number of main FETs in the first group is equal to the number of FETs in the second group. It is to be understood that while the eighth embodiment of FIG. 8 is depicted with N equal to 8 of the N number of main FETs 12, Q1-Q8, a larger number of main FETs may be included without deviating from the scope of the present disclosure.

Figure 9:
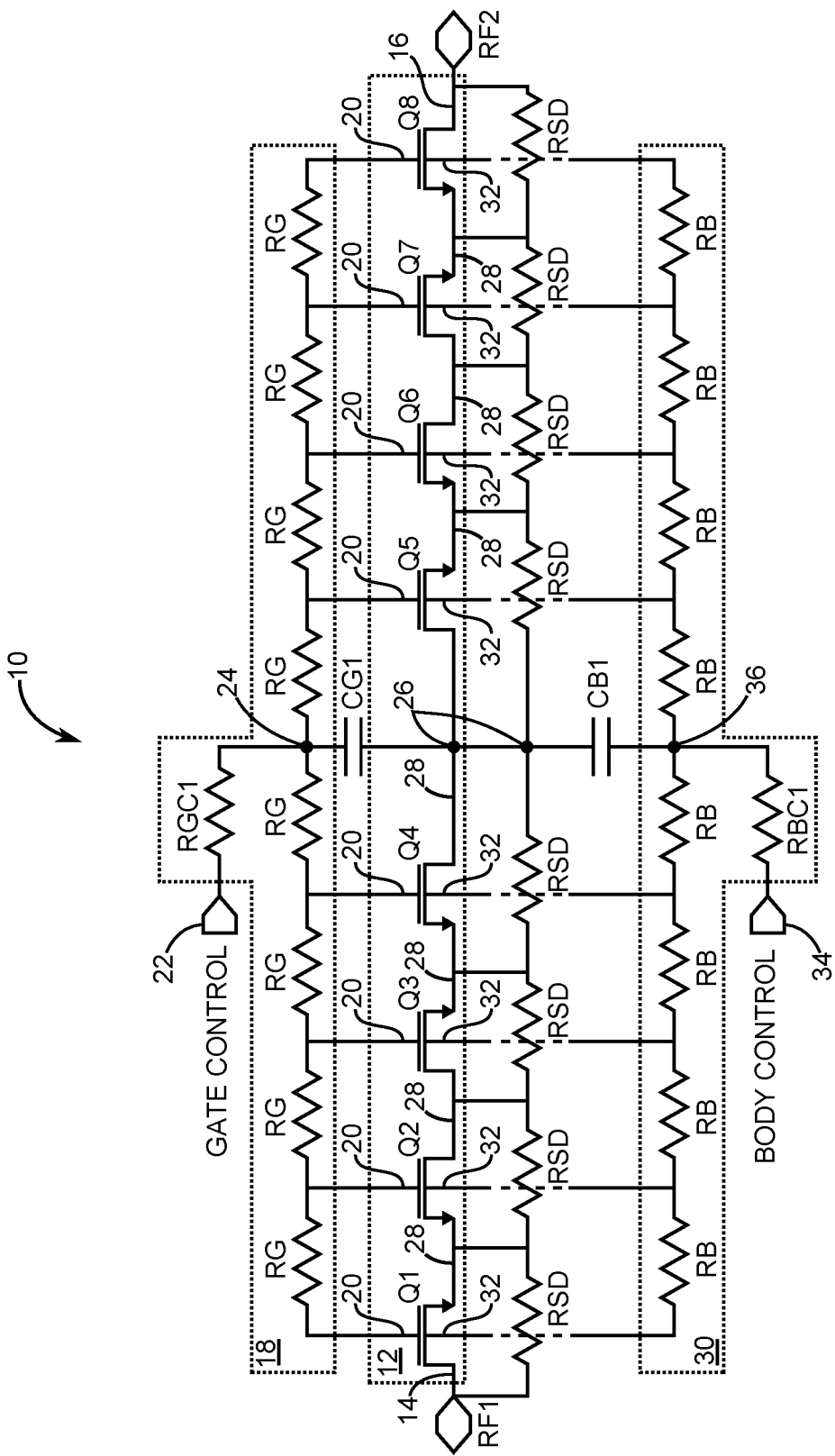
FIG. 9 is a schematic of a ninth embodiment of the transistor-based RF switch of the present disclosure.

FIG. 9 is a schematic of a ninth embodiment of the transistor-based RF switch 10 of the present disclosure. In this exemplary embodiment, a first group Q2, Q4, Q6, and Q8 of the N number of main FETs 12 has source terminals that are closer to the first end node RF1 and drain terminals that are closer to the second end node RF2, and a second group Q1, Q3, Q5, and Q7 of the N number of main FETs 12 has drain terminals that are closer to the first end node RF1 and source terminals that are closer to the second end node RF2, wherein the number of main FETs in the first group is equal to the number of FETs in the second group. It is to be understood that while the ninth embodiment of FIG. 9 is depicted with N equal to 8 of the N number of main FETs 12, Q1-Q8, a larger number of main FETs may be included without deviating from the scope of the present disclosure.

Figure 10:
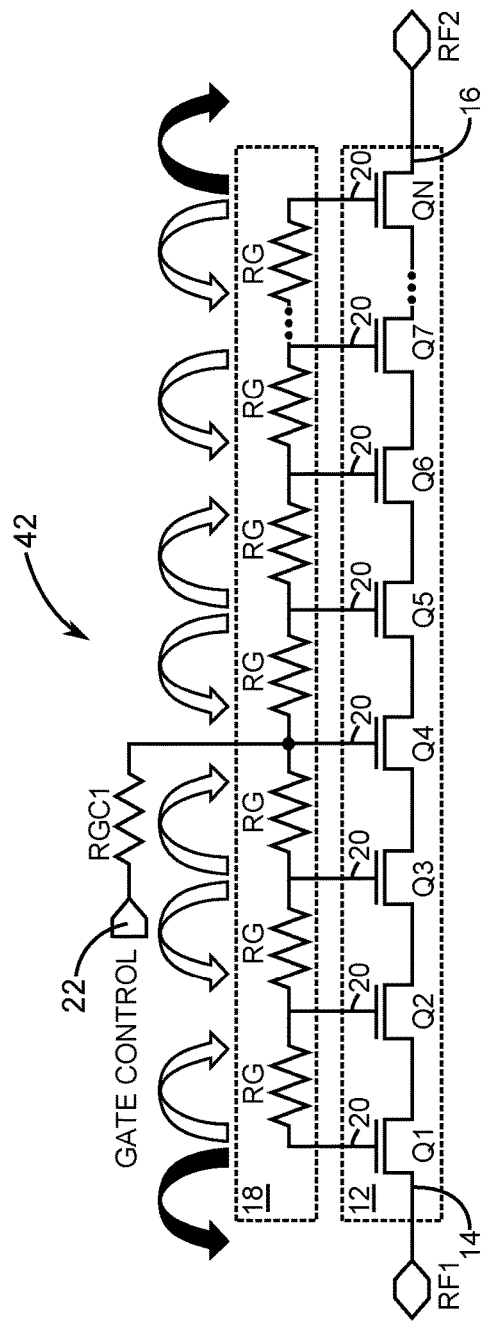
FIG. 10 is a diagram depicting the stack of main FETs without loads at either end of the stack of main FETs to illustrate resulting asymmetric RF impedance.

FIG. 10 is a diagram depicting a related-art RF switch 42 without loads at the ends of the stack of main FETs 12, Q1-QN. The related-art RF switch 42 also includes the gate bias network 18 that is coupled to the gate control input 22 through the common resistor RGC1. The related-art RF switch 42 transitions to an on-state that allows an RF signal to pass between the first end node RF1 and the second end node RF2 when a positive voltage that is above a threshold voltage of the stack of main FETs 12 is applied to the gate control input 22. In contrast, the related-art RF switch 42 transitions to an off-state that prevents an RF signal from passing between the first end node RF1 and the second end node RF2 when a negative voltage that is below the threshold voltage of the stack of main FETs 12 is applied to the gate control input 22. Off-state capacitances and off-state resistances and parasitic capacitances of metal layers contribute to the RF impedances of the stack of main FETs when the transistor-based RF switch 44 is in the off-state.

In FIG. 10, symmetric RF impedance is represented by pairs of white-filled arrows, whereas asymmetric RF impedance is represented by white-filled arrows paired with black-filled arrows at the ends of the related-art RF switch 42. The asymmetric RF impedance generates even-order harmonics when an RF signal is applied to the related-art RF switch 42 while the related-art RF switch 42 is the off-state. Even-order harmonics are increasingly undesirable as RF spectrum use becomes denser and as cellular telephony and wireless communications transition to wider bandwidth applications. Thus, there is a further need for an RF switch having symmetric RF impedance throughout the RF switch and at the ends of the RF switch.

Figure 11:
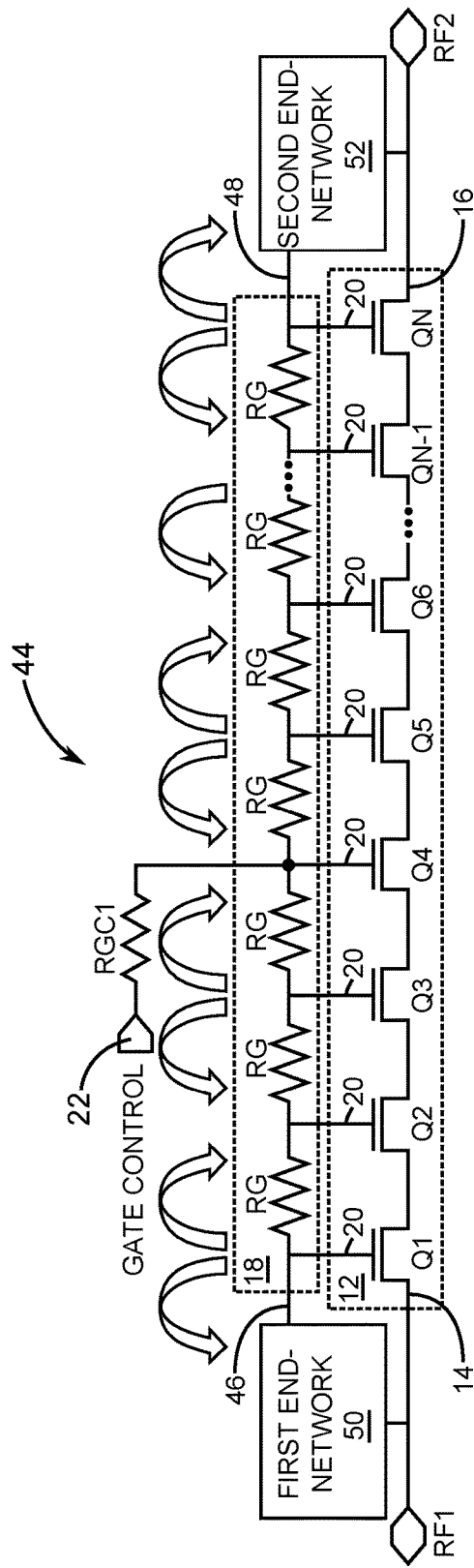
FIG. 11 is a diagram depicting a generalized embodiment of transistor-based RF switch having end-networks that provide symmetric RF impedance to both ends of the stack of main FETs in accordance with the present disclosure.

In this regard, FIG. 11 is a diagram depicting a first embodiment of a transistor-based RF switch 44 that in accordance with the present disclosure provides symmetric RF impedance throughout the transistor-based RF switch 44 and at the ends of the transistor-based RF switch 44. The transistor-based RF switch 44 includes the stack of main FETs 12, the gate bias network 18, and the gate control input 22 coupled to the gate bias network 18 through the common resistor RGC1. The first terminal 14 of the FET Q1 is coupled to the first end node RF1, and the second terminal 16 of the FET QN is coupled to the second end node RF2. The gate bias network 18 includes a plurality of gate resistors RG coupled in series between a proximal gate node 46 and a distal gate node 48, wherein each resistor of the plurality of gate resistors RG is coupled between gate terminals 20 of an adjacent pair of the N number of main FETs 12.

The transistor-based RF switch 44 further includes a first end-network 50 and a second end-network 52 that provide symmetric RF impedance to both ends of the stack of main FETs 12. Thus, the overall impedances between all of the FETS Q1-QN making up the stack of main FETs 12 are symmetrical within the transistor-based RF switch 44. The symmetrical impedances equalize drain-to-source voltages for each of the FETs Q1-QN making up the stack of main FETs 12.

In particular, the first end-network 50 is coupled between the first end node RF1 and the proximal gate node 46, wherein the first end-network 50 provides variable impedance that equalizes a drain-to-source voltage of the first main FET Q1 to within a predetermined percentage of a drain-to-source voltage of the second main FET Q2 of the N number of main FETs 12. The second end-network 52 is coupled between the second end node RF2 and the distal gate node 48, wherein the second end-network 52 provides variable impedance that equalizes a drain-to-source voltage of the last main FET QN to within a predetermined percentage of a drain-to-source voltage of the next-to-last main FET QN−1 of the N number of main FETs 12. In some embodiments, the predetermined percentages are within ±5%. In at least other embodiments, the predetermined percentages range within ±4%, ±3%, ±2%, and ±1%. The variable impedances provided by the first end-network 50 and the second end-network 52 have higher impedance values when the transistor-based RF switch 44 is in the off-state and lower impedances values in the on-state. In some exemplary embodiments, the higher impedance values are at least an order of magnitude larger than the lower impedance values. In other exemplary embodiments, the higher impedance values are at least two orders of magnitude larger than the lower impedance values.

Figure 12B:
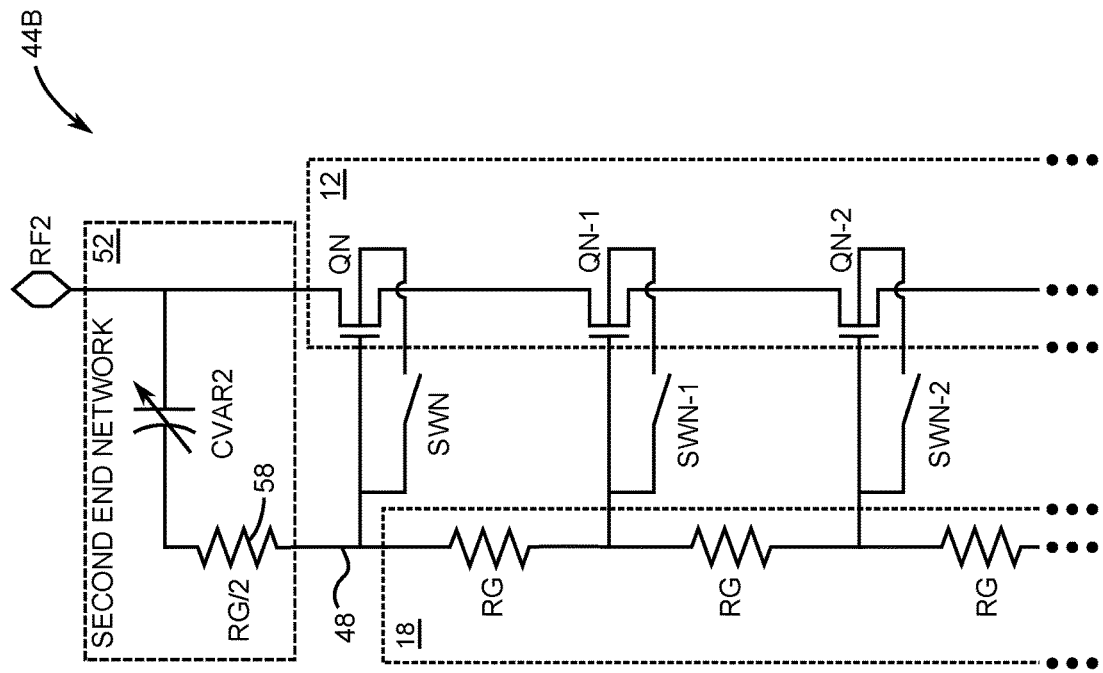
FIG. 12B is a diagram depicting a second switch portion, which taken together with the first switch portion of FIG. 12A, illustrates the detailed first exemplary embodiment of the transistor-based RF switch of FIG. 11.
Figure 12A:
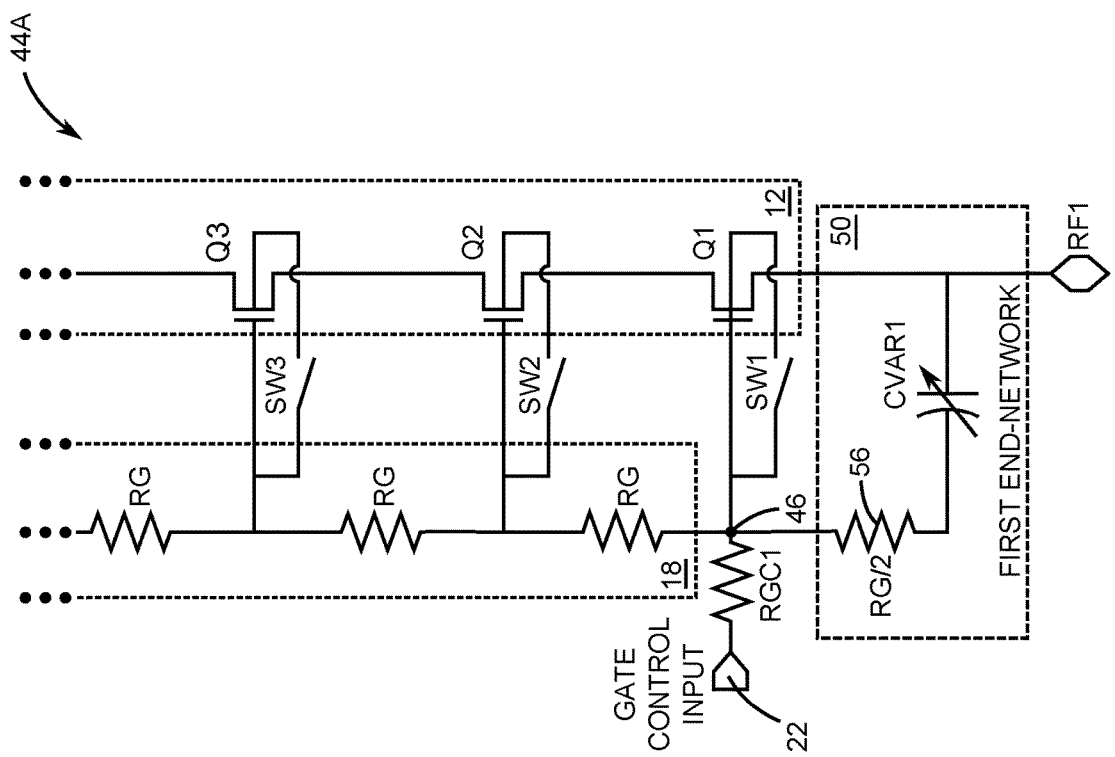
FIG. 12A is a diagram depicting a first switch portion of a detailed first exemplary embodiment of the transistor-based RF switch of FIG. 11.

FIG. 12A and FIG. 12B are diagrams depicting a first switch portion 44A and a second switch portion 44B of an exemplary embodiment of the transistor-based RF switch 44 of FIG. 11. In this exemplary embodiment, the first end-network 50 is made up of a first network resistor 56 coupled in series with a first variable capacitor CVAR1. The second end-network 52 is made up of a second network resistor 58 coupled in series with a second variable capacitor CVAR2. The first network resistor 56 and the second network resistor 58 typically each have half the resistance of individual ones of the gate resistors RG. In this exemplary embodiment, the first network resistor 56 and the second network resistor 58 each has a resistance value that is within ±5% one half an average resistance value of individual ones of the plurality of gate resistors RG. Also, in this exemplary embodiment, the first variable capacitor CVAR1 and the second variable capacitor CVAR2 are accumulation-type varactor diodes.

Further included are auxiliary body switches SW1, SW2, SW3, SWN−2, SWN−1, and SWN that couple the bodies of the FETs Q1, Q2, Q3, QN−2, QN−1, and QN to the gate bias network 18 when the transistor-based RF switch 44 is in the off-state. In this particular exemplary embodiment, the gate control input 22 is coupled to the proximal gate node 46 through the common resistor RGC1. However, it is to be understood that in certain embodiments such as depicted in FIG. 11, the gate control input 22 can be coupled to other nodes within the gate bias network 18.

Figure 13A:
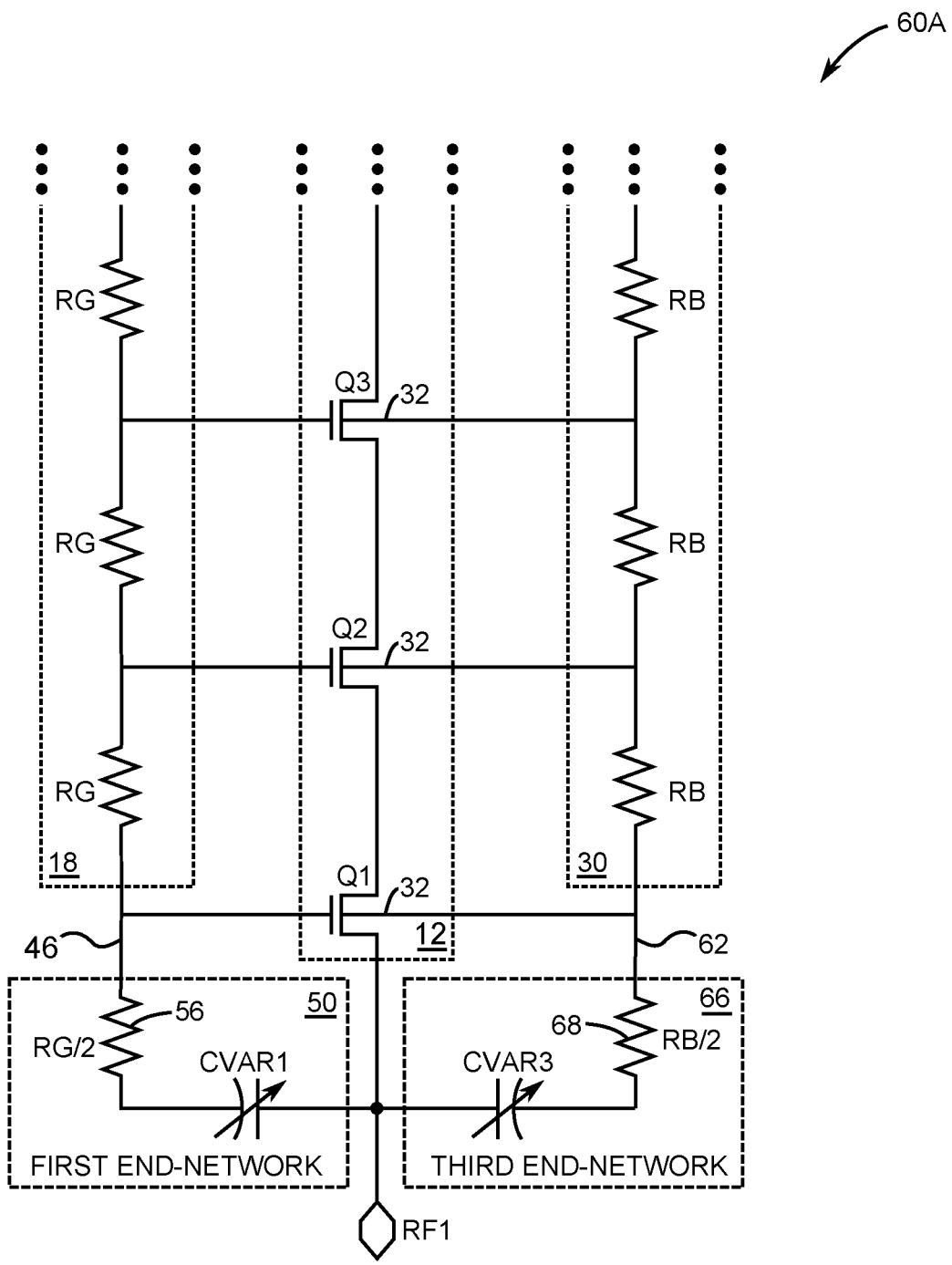
FIG. 13A is a diagram depicting a first switch portion of a detailed second exemplary embodiment of the transistor-based RF switch of FIG. 11.
Figure 13B:
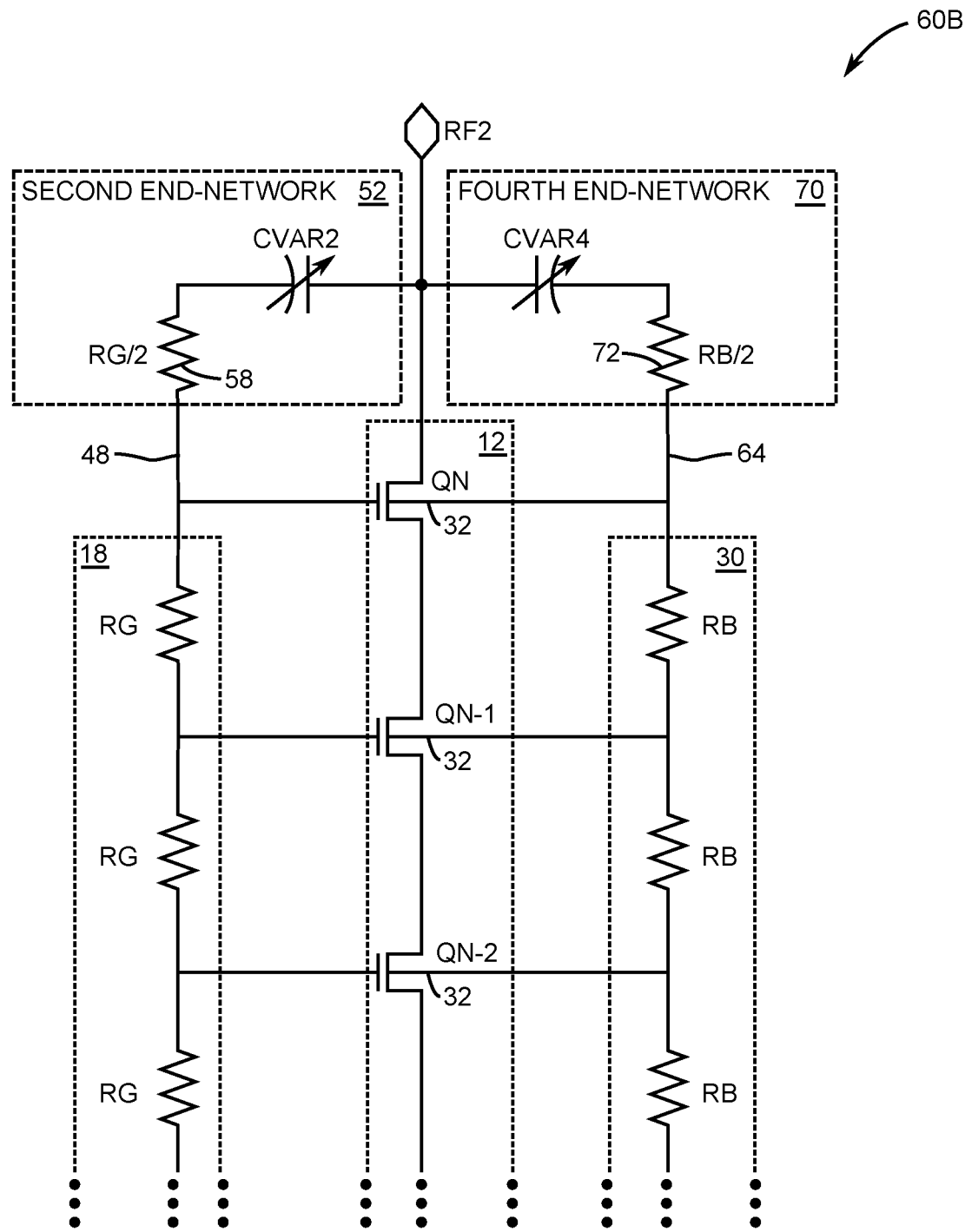
FIG. 13B is a diagram of a second switch portion, which taken together with the first switch portion of FIG. 13A, illustrates the detailed second exemplary embodiment of the transistor-based RF switch of FIG. 11.

FIG. 13A is a diagram depicting a first switch portion 60A and, shown on a separate sheet, FIG. 13B is a diagram of a second switch portion 60B, both of which taken together illustrate another exemplary embodiment of the transistor-based RF switch 44 of FIG. 11. As depicted in both FIGS. 13A and 13B, this embodiment further includes the body bias network 30 having the plurality of body resistors RB coupled in series between a proximal body node 62 and a distal body node 64, wherein each resistor of the plurality of body resistors RB is coupled between the body terminals 32 of adjacent ones of the N number of main FETs 12.

As shown in FIG. 13A, this embodiment also includes a third end-network 66 that is coupled between the first end node RF1 and the proximal body node 62, wherein the third end-network 66 provides variable impedance that further equalizes the drain-to-source voltage of the first main FET Q1 to within a predetermined percentage of the drain-to-source voltage of the second main FET Q2 of the N number of main FETs 12. In this particular embodiment, the third end-network 66 is made up of a third network resistor 68 coupled in series with a third variable capacitor CVAR3, which in this exemplary embodiment is an accumulation-type varactor diode.

Turning to FIG. 13B, this embodiment also includes a fourth end-network 70 that is coupled between the second end node RF2 and a distal body node 64, wherein the fourth end-network 70 provides variable impedance that further equalizes the drain-to-source voltage of the last main FET QN to within a predetermined percentage of a drain-to-source voltage of the next-to-last main FET QN−1 of the N number of main FETs 12. In this particular embodiment, the fourth end-network 70 is made up of a fourth network resistor 72 coupled in series with a fourth variable capacitor CVAR4, which in this exemplary embodiment is an accumulation-type varactor diode. In the exemplary embodiment of FIGS. 13A and 13B, the third network resistor 68 and the fourth network resistor 72 each have resistance values that are within ±5% one half an average resistance value of individual ones of the plurality of body resistors.

Figure 14A:
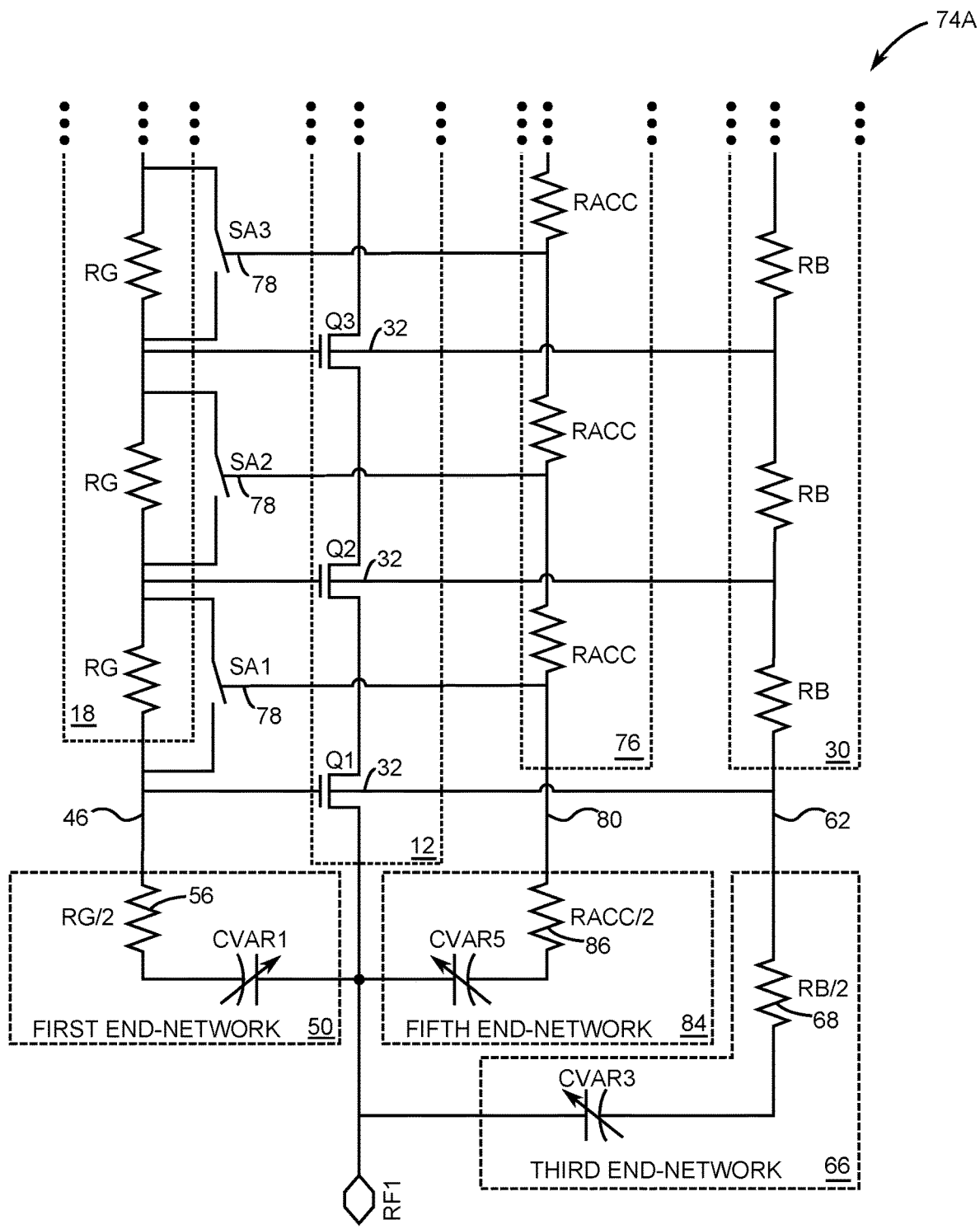
FIG. 14A is a diagram depicting a first switch portion of a detailed third exemplary embodiment of the transistor-based RF switch of FIG. 11.
Figure 14B:
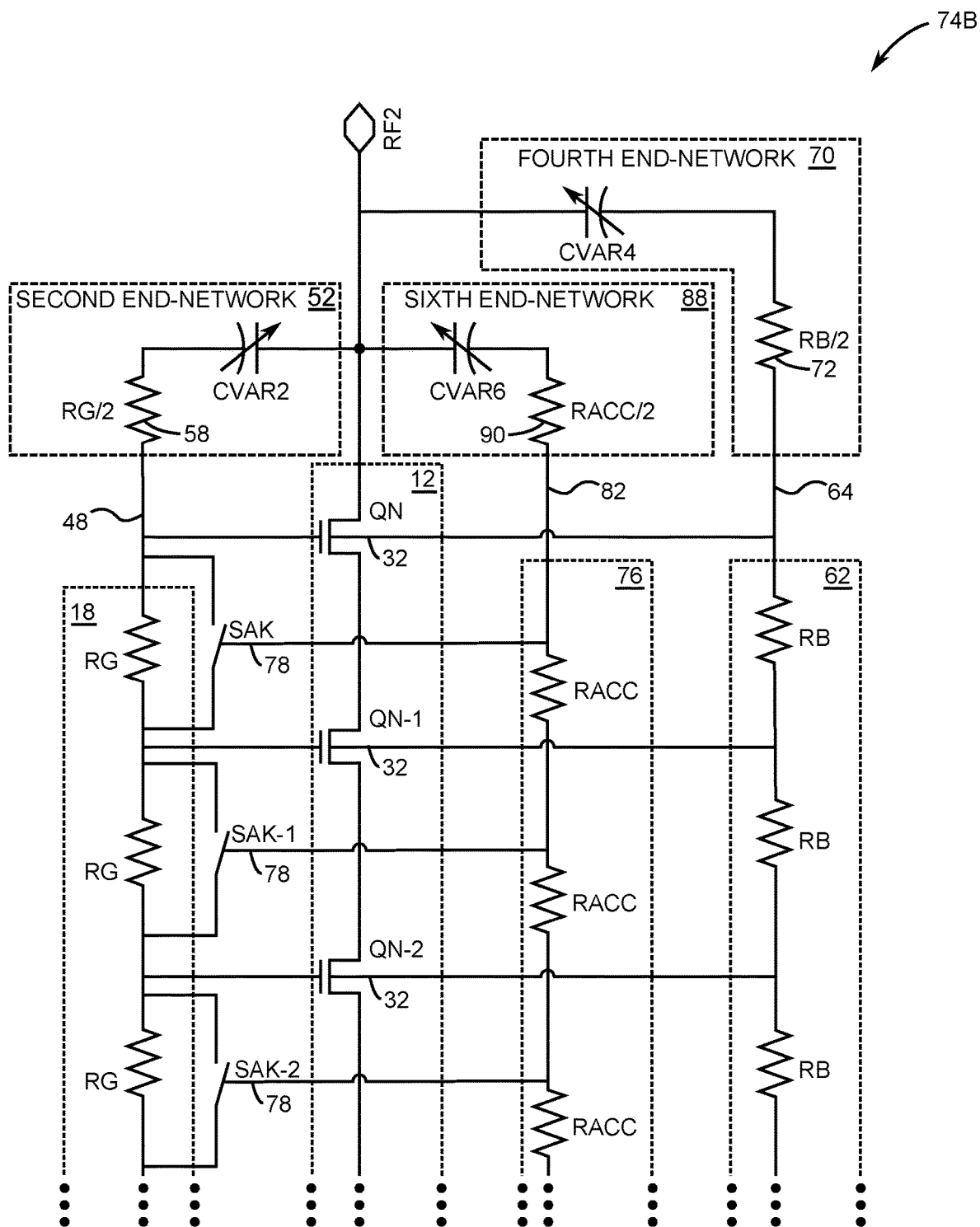
FIG. 14B is a diagram of a second switch portion, which taken together with the first switch portion of FIG. 14A, illustrates the detailed third exemplary embodiment of the transistor-based RF switch of FIG. 11.

FIG. 14A is a diagram depicting a first switch portion 74A and, shown on an separate sheet, FIG. 14B is a diagram of a second switch portion 74B, both of which taken together illustrate yet another exemplary embodiment of the transistor-based RF switch 44 of FIG. 11. As depicted in both FIGS. 14A and 14B, this embodiment further includes acceleration switches SA1, SA2, SA3, SAK−2, SAK−1, and SAK coupled across corresponding ones of the plurality of gate resistors RG, wherein K is an integer counting number greater than two.

Also included is an acceleration bias network 76 having a plurality of acceleration resistors RACC coupled in series between a proximal acceleration node 80 and a distal acceleration node 82, wherein each resistor of the plurality of acceleration resistors RACC is coupled between switch control terminals 78 of adjacent ones of the acceleration switches SA1, SA2, SA3, SAK−2, SAK−1, and SAK. The acceleration switches speed up turn-on and turn-off times of the N number of main FETs 12 by shorting the plurality of gate resistors RG during transitioning between the on-state and the off-state. The acceleration switches SA1, SA2, SA3, SAK−2, SAK−1, and SAK affect the impedances seen by the gates and bodies of the N number of main FETs 12 even during the off-state, and thus impedance balance is desirable for ends of the acceleration bias network 76.

As shown in FIG. 14A, this embodiment also includes a fifth end-network 84 that is coupled between the first end node RF1 and the proximal acceleration node 80, wherein the fifth end-network 84 provides variable impedance that further equalizes the drain-to-source voltage of the first main FET Q1 to within a predetermined percentage of the drain-to-source voltage of the second main FET Q2 of the N number of main FETs 12. In this particular embodiment, the fifth end-network 84 is made up of a fifth network resistor 86 coupled in series with a fifth variable capacitor CVAR5, which in this exemplary embodiment is an accumulation-type varactor diode.

Turning to FIG. 14B, this embodiment also includes a sixth end-network 88 that is coupled between the second end node RF2 and the distal acceleration node 82, wherein the sixth end-network 88 provides variable impedance that further equalizes the drain-to-source voltage of the last main FET QN to within a predetermined percentage of a drain-to-source voltage of the next-to-last main FET QN−1 of the N number of main FETs 12. In this particular embodiment, the sixth end-network 88 is made up of a sixth network resistor 90 coupled in series with a sixth variable capacitor CVAR6, which in this exemplary embodiment is an accumulation-type varactor diode. In the exemplary embodiment of FIGS. 14A and 14B, the first variable capacitor CVAR1, the second variable capacitor CVAR2, the third variable capacitor CVAR3, the fourth variable capacitor CVAR4, the fifth variable capacitor CVAR5, and the sixth variable capacitor CVAR6 have lower capacitances when the transistor-based RF switch 44 made up the first switch portion 74A and second switch portion 74B is an on-state and higher capacitances when the transistor-based RF switch 44 is in an off-state. In the exemplary embodiment of FIGS. 14A and 14B, the fifth network resistor 86 and the sixth network resistor 72 each have resistance values that are within ±5% one half an average resistance value of individual ones of the plurality of acceleration resistors RACC.

Figures 15A, 15B:
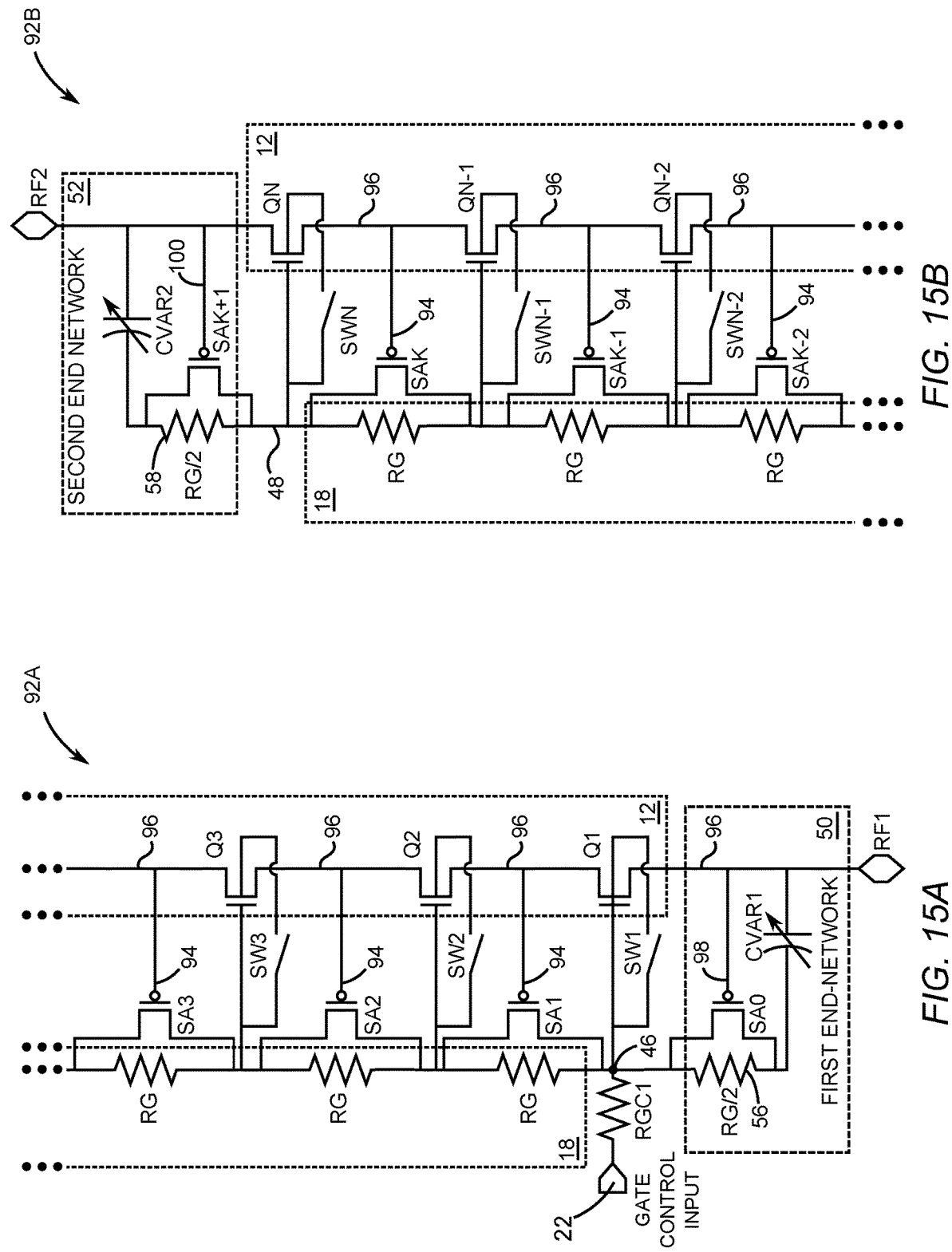
FIG. 15A is a diagram depicting a first switch portion of a detailed fourth exemplary embodiment of the transistor-based RF switch of FIG. 11.
FIG. 15B is a diagram of a second switch portion, which taken together with the first switch portion of FIG. 15A, illustrates the detailed fourth exemplary embodiment of the transistor-based RF switch of FIG. 11.

FIG. 15A and FIG. 15B are diagrams depicting a first switch portion 92A and a second switch portion 92B of an exemplary embodiment of the transistor-based RF switch 44 of FIG. 11. In this exemplary embodiment, the acceleration switches SA1, SA2, SA3, SAK−2, SAK−1, and SAK coupled across corresponding ones of the plurality of gate resistors RG are p-FETs. Gates 94 of the p-FETs are coupled to corresponding drain-source nodes 96 that are located between adjacent pairs of the N number of main FETs. Further still, two additional acceleration switches SA0 and SAK+1 are coupled across first network resistor 56 and second network resistor 58, respectively. The acceleration switch SA0 has a gate 98 coupled to the first end node RF1, and the acceleration switch SAK+1 has a gate 100 coupled to the second end node RF2. The acceleration switches SA0, SA1, SA2, SA3, SAK−2, SAK−1, SAK and SAK+1 have an advantage of eliminating relatively long resistor-capacitor (RC) time constants that result from turn-on current flowing through the gate bias network 18 to charge parasitic capacitances associated with the N number of main FETs 12.

Those skilled in the art will recognize improvements and modifications to the preferred embodiments of the present disclosure. All such improvements and modifications are considered within the scope of the concepts disclosed herein and the claims that follow.

What is claimed is:

1. A transistor-based radio frequency (RF) switch comprising:
   an N number of main field-effect transistors (FETs) stacked in series between a first end node and a second end node such that a first terminal of a first main FET of the N number of main FETs is coupled to the first end node and a second terminal of an Nth main FET of the N number of main FETs is coupled to the second end node, wherein N is a finite integer greater than two;
   a plurality of gate resistors coupled in series between a proximal gate node and a distal gate node, wherein each gate resistor of the plurality of gate resistors is coupled between gates of an adjacent pair of the N number of main FETs;
   a first end-network coupled between the first end node and the proximal gate node, wherein the first end-network provides a first variable impedance that equalizes a drain-to-source voltage of the first main FET of the N number of main FETs to within ±5% of a drain-to-source voltage of a second main FET of the N number of main FETs; and
   a second end-network coupled between the second end node and the distal gate node, wherein the second end-network provides a second variable impedance to equalize the drain-to-source voltage of an Nth main FET of the N number of main FETs to within ±5% of the drain-to-source voltage of an N−1 main FET of the N number of main FETs.

2. The transistor-based RF switch of claim 1 wherein the first end-network comprises a first network resistor coupled in series with a first variable capacitor that together provide the first variable impedance, and the second end-network comprises a second network resistor coupled in series with a second variable capacitor that together provide the second variable impedance.

3. The transistor-based RF switch of claim 2 wherein the first variable capacitor and the second variable capacitor are accumulation-type varactor diodes.

4. The transistor-based RF switch of claim 2 wherein the first network resistor and the second network resistor each have resistance values that are within ±5% one half an average resistance value of individual ones of the plurality of gate resistors.

5. The transistor-based RF switch of claim 2 further including a body bias network having a plurality of body resistors coupled in series between a proximal body node and a distal body node, wherein each body resistor of the plurality of body resistors is coupled between body terminals of an adjacent pair of the N number of main FETs.

6. The transistor-based RF switch of claim 5 further comprising:
   a third end-network coupled between the first end node and the proximal body node, wherein the third end-network provides a third variable impedance that further equalizes the drain-to-source voltage of the first main FET of the N number of main FETs to within ±5% of the drain-to-source voltage of the second main FET of the N number of main FETs; and
   a fourth end-network coupled between the second end node and the distal body node, wherein the fourth end-network provides a fourth variable impedance to further equalize the drain-to-source voltage of the Nth main FET of the N number of main FETs to within ±5% of the drain-to-source voltage of the N−1 main FET of the N number of main FETs.

7. The transistor-based RF switch of claim 6 wherein the third end-network comprises a third network resistor coupled in series with a third variable capacitor that together provide the third variable impedance, and the fourth end-network comprises a fourth network resistor coupled in series with a fourth variable capacitor that together provide the fourth variable impedance.

8. The transistor-based RF switch of claim 7 wherein the third variable capacitor and the fourth variable capacitor are accumulation-type varactor diodes.

9. The transistor-based RF switch of claim 7 wherein the third network resistor and the fourth network resistor each have resistance values that are within ±5% one half an average resistance value of individual ones of the plurality of body resistors.

10. The transistor-based RF switch of claim 7 further including a plurality of acceleration switches coupled across corresponding ones of the plurality of gate resistors.

11. The transistor-based RF switch of claim 10 further including an acceleration bias network having a plurality of acceleration resistors coupled in series between a proximal acceleration node and a distal acceleration node, wherein each acceleration resistor of the plurality of acceleration resistors is coupled between switch control terminals of adjacent ones of the plurality of acceleration switches.

12. The transistor-based RF switch of claim 11 further comprising:

a fifth end-network coupled between the first end node and the proximal acceleration node, wherein the fifth end-network provides a fifth variable impedance that further equalizes the drain-to-source voltage of the first main FET of the N number of main FETs to within ±5% of the drain-to-source voltage of the second main FET of the N number of main FETs; and a sixth end-network coupled between the second end node and the distal acceleration node, wherein the sixth end-network provides a sixth variable impedance to further equalize the drain-to-source voltage of the Nth main FET of the N number of main FETs to within ±5% of the drain-to-source voltage of the N−1 main FET of the N number of main FETs.

13. The transistor-based RF switch of claim 12 wherein the fifth end-network comprises a fifth network resistor coupled in series with a fifth variable capacitor that together provide the fifth variable impedance, and the sixth end-network comprises a sixth network resistor coupled in series with a sixth variable capacitor that together provide the sixth variable impedance.

14. The transistor-based RF switch of claim 13 wherein the fifth variable capacitor and the sixth variable capacitor are accumulation-type varactor diodes.

15. The transistor-based RF switch of claim 13 wherein the fifth network resistor and the sixth network resistor each have resistance values that are within ±5% one half an average resistance value of individual ones of the plurality of acceleration resistors.

16. The transistor-based RF switch of claim 13 wherein the first variable capacitor, the second variable capacitor, the third variable capacitor, the fourth variable capacitor, the fifth variable capacitor, and the sixth variable capacitor have lower capacitance when the transistor-based RF switch is an on-state and a higher capacitance when the transistor-based RF switch is in an off-state.

17. The transistor-based RF switch of claim 10 further including a first end acceleration switch coupled across the first network resistor, wherein a gate of the first end acceleration switch is coupled to the first end node.

18. The transistor-based RF switch of claim 10 further including a second end acceleration switch coupled across the second network resistor, wherein a gate of the second end acceleration switch is coupled to the second end node.

19. The transistor-based RF switch of claim 10 further including a first end acceleration switch coupled across the first network resistor and a second end acceleration switch coupled across the second network resistor, wherein a gate of the first end acceleration switch is coupled to the first end node and a gate of the second end acceleration switch is coupled to the second end node.

20. The transistor-based RF switch of claim 19 wherein the plurality of acceleration switches are p-FETs.

* * * * *